March 14, 1972 ISAMU AKASAKI 3,649,383
PROCESS OF FABRICATING ELECTROLUMINESCENT ELEMENT
Filed March 17, 1969

INVENTOR
ISAMU AKASAKI
BY STEVENS, DAVIS, MILLER & MOSHER
ATTORNEYS

United States Patent Office 3,649,383

Patented Mar. 14, 1972

3,649,383

PROCESS OF FABRICATING ELECTRO-LUMINESCENT ELEMENT

Isamu Akasaki, Osaka, Japan, assignor to Matsushita Electric Industrial Co., Ltd., Osaka, Japan Filed Mar. 17, 1969, Ser. No. 807,688

Claims priority, application Japan, Mar. 23, 1968, 43/19,576

Int. Cl. H01l *7/46, 15/00;* C23c *3/00*

U.S. Cl. 148—171 4 Claims

ABSTRACT OF THE DISCLOSURE

A process for fabricating an electroluminescent element of a semiconductor material consisting of two layers of mutually different conductivity types, particularly including the steps of coating grains of a p-type (for example) electroluminescent semiconductor crystal with insulating material, hot-pressing the coated grains into a single-grain layer, etching opposite surfaces of said layer to remove the insulating coating at the surfaces, and growing another layer of the semiconductor material of n-type, whereby the crystal grains in the first layer are insulated from one another in the transverse direction.

This invention relates to a process of fabricating an electroluminescent element and, more particularly, to a process of forming a p-n junction electroluminescent element which has a relatively large size and emits light with increased efficiency.

A crystal of an existing semiconductor material used for the formation of a p-n junction electroluminescent element of, for example, gallium phosphide is usually fabricated by a process of crystal growth from the liquid phase of some appropriate compound of a semiconductor material. At the present time, however, restraints are imposed on the electroluminescent element so fabricated in that the size of the material semiconductor crystal is restricted within certain limits.

Another typical process of fabricating a p-n junction electroluminescent element is the vapor growth process. Although it provides for increased size of the crystal, difficulties are still experienced in fabricating electroluminescent element by the vapor-growth process in that the fabrication involves disproportionately complex operations and in that the product obtained by this process exhibits unsatisfactory light emission efficiency.

In order to overcome these disadvantages, the invention contemplates the provision of an improved process of fabricating a p-n junction electroluminescent element having increased size light emission efficiency. For this purpose, the invention proposes fabrication of the p-n junction electroluminescent element by a process preparing fine crystals of an electroluminescent semiconductor material of a given conductivity type, the dimensions of the particles of said semiconductor material being made comparable with the predetermined thickness of the intended layer; evaporating an insulating material onto the particles of said semiconductor material; hot-pressing said coated particles of semiconductor material to a layer having a thickness substantially corresponding to said predetermined thickness: liquid-phase etching both surfaces of said hot-pressed layer to remove the insulating material at the surfaces; and liquid-phase growing, on a layer of said hot-pressed layer, another layer of the semiconductor material having a conductivity type opposite to that of said hot-pressed layer.

Figure 1:
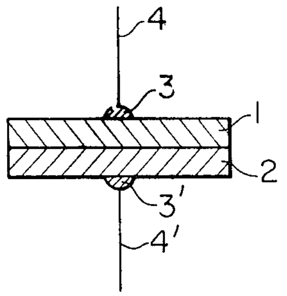
FIG. 1 shows a section of a conventional electroluminescent element.

Referring to FIG. 1, the conventional p-n junction electroluminescent element comprises a p-type gallium phosphide layer 1, an n-type gallium phosphide layer 2, a pair of electrodes 3 and 3' connected with the layer 1 and 2, respectively, and p- and n-region lead wires 4 and 4', respectively.

Figure 2:
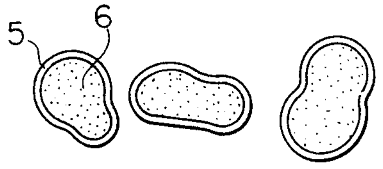
FIG. 2 shows a section of the material crystal covered with an insulating material.
Figure 3:
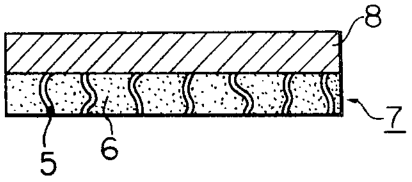
FIG. 3 shows a section of the p- and n-type layers formed by the process of the invention.

According to the invention, a suitable insulating material 5 is applied to fine crystals 6 of p-type gallium phosphide, as illustrated in FIG. 2. The insulating material 5 may be silicon dioxide, magnesium oxide or insulative (undoped) silicon carbide, for example, while the gallium phosphide crystals may contain zinc or zinc and oxygen. The crystals thus coated with an insulating material is then hot-pressed into a desired shape having a thickness substantially equal to the diameter, or more precisely, overall size of the crystal.

Since, in this instance, the resultant layer 7 is not provided with satisfactorily smooth surfaces and since it is coated with the insulating material, it is necessary to have the surface of the p-type layer 7 (which has been formed by hot-pressing) thinly etched in a gallium or tin solution.

The layer 7 is then subjected to a liquid-phase growth process of the n-type layer 8 to be joined therewith.

The crystal 6 may be doped with a desired amount of impurities and may have a size on the order of 1 mm. Coating of the crystal 6 with an insulating material 5 is required since, when the layer 7 formed of the crystal is joined with the semiconductor layer 8, it is necessary to prevent current from flowing through the boundaries between particles where the current meets the least resistance. Since such boundaries do not form a p-n junction at the interface between two layers, the current flowing through boundaries is not effective in the production of electroluminescence.

It will be understood that the process herein described proves advantageous if it is applied to the formation of other types of electroluminescent material of, for example, gallium arsenide and doped silicon carbide.

I claim:

1. A process for fabricating an electroluminescent element of a semiconductor material consisting of two layers, a p-n junction being formed therebetween, said process comprising the steps of:

preparing fine crystals of an electroluminescent semiconductor material of a given conductivity type, the dimensions of the particles of said semiconductor material being made comparable with the predetermined thickness of the intended layer;

evaporating an insulating material onto the particles of said semiconductor material;

hot-pressing said coated particles of semiconductor material to a layer having a thickness substantially corresponding to said predetermined thickness;

liquid-phase etching both surfaces of said hot-pressed layer to remove the insulating material at the surfaces; and liquid-phase growing, on a layer of said hot-pressed layer, another layer of the semiconductor material having a conductivity type opposite to that of said hot-pressed layer.

2. A process as defined in claim 1, wherein said insulating material is selected from the group consisting of silicon dioxide, magnesium oxide and insulative silicon carbide.

3. A process as defined in claim 1, wherein said semiconductor material is selected from the group consisting of gallium phosphide, gallium arsenide and silicon carbide.

4. A process as defined in claim 1, wherein said liquid-phase etching is performed with gallium or tin solution.

References Cited

UNITED STATES PATENTS

| | | | |
|---|---|---|---|
| 2,904,613 | 9/1959 | Paradise | 29—572 X |
| 3,038,952 | 6/1962 | Ralph | 136—89 |
| 3,396,057 | 8/1968 | Webb | 136—89 |
| 3,463,715 | 8/1969 | Bloom | 204—192 |
| 3,476,640 | 11/1969 | Sirtl et al. | 117—201 X |
| 3,480,818 | 11/1969 | Velde | 317—235 X |

L. DEWAYNE RUTLEDGE, Primary Examiner

W. G. SABA, Assistant Examiner

U.S. Cl. X.R.

29—572; 117—33.5 E, 66, 106 A, 201, 213; 136—89; 148—1.5, 174, 175; 317—234 R, 235 N